United States Patent
Kuo

(10) Patent No.: US 9,773,944 B2
(45) Date of Patent: Sep. 26, 2017

(54) LIGHT-EMITTING DIODE

(71) Applicant: Lextar Electronics Corporation, Hsinchu (TW)

(72) Inventor: Shiou-Yi Kuo, Kaohsiung (TW)

(73) Assignee: Lextar Electronics Corporation, Hsinchu (TW)

( * ) Notice: Subject to any disclaimer, the term of this patent is extended or adjusted under 35 U.S.C. 154(b) by 161 days.

(21) Appl. No.: 14/290,974

(22) Filed: May 29, 2014

(65) Prior Publication Data

US 2015/0115276 A1 Apr. 30, 2015

(30) Foreign Application Priority Data

Oct. 25, 2013 (TW) .............................. 102138694 A

(51) Int. Cl.
*H01L 33/10* (2010.01)
*H01L 33/38* (2010.01)
*H01L 33/14* (2010.01)
*H01L 33/32* (2010.01)
*H01L 33/44* (2010.01)

(52) U.S. Cl.
CPC ............ *H01L 33/10* (2013.01); *H01L 33/145* (2013.01); *H01L 33/32* (2013.01); *H01L 33/38* (2013.01); *H01L 33/44* (2013.01)

(58) Field of Classification Search
CPC ............. H01L 33/14; H01L 2933/0016; H01L 33/145; H01L 33/22; H01L 33/38; H01L 33/405; H01L 33/0025; H01L 33/007; H01L 33/0075; H01L 33/0079; H01L 33/04; H01L 33/06; H01L 33/20; H01L 33/325; H01L 2933/0083; H01L 33/10

USPC ............. 257/13, E33.005, E33.008, E33.06, 257/E33.065, 98, 99, E21.002, E33.013, 257/E33.023, E33.066, E33.072, 76, 77; 438/22, 37, 29, 46

See application file for complete search history.

(56) References Cited

U.S. PATENT DOCUMENTS

| | | | |
|---|---|---|---|
| 2010/0012962 A1* | 1/2010 | Hong | ...................... H01L 33/46 257/98 |
| 2010/0167434 A1 | 7/2010 | Fang et al. | |
| 2011/0140077 A1* | 6/2011 | Song | ...................... H01L 33/04 257/13 |
| 2012/0025251 A1* | 2/2012 | Kazama | ................... H01L 33/20 257/98 |
| 2012/0146075 A1 | 6/2012 | Deguchi | |

(Continued)

FOREIGN PATENT DOCUMENTS

KR 20070006947 A 1/2007

*Primary Examiner* — Edward Chin
(74) *Attorney, Agent, or Firm* — Moser Taboada

(57) ABSTRACT

The disclosure provides a light-emitting diode which includes a first semiconductor layer, a light-emitting layer, a second semiconductor layer, a reflective layer, a current blocking layer and a current spreading layer. The light-emitting layer is positioned on the first semiconductor layer, and the second semiconductor layer is positioned on the light-emitting layer. The reflective layer is positioned on a part of the second semiconductor layer, so as to expose another part of the second semiconductor layer. The current blocking layer covers the reflective layer, and the current spreading layer covers the exposed second semiconductor layer and current blocking layer.

18 Claims, 5 Drawing Sheets

(56) References Cited

U.S. PATENT DOCUMENTS

| | | | |
|---|---|---|---|
| 2013/0009167 A1* | 1/2013 | Tan | H01L 33/44 257/77 |
| 2013/0032847 A1* | 2/2013 | Chuang | H01L 33/145 257/99 |
| 2015/0053920 A1* | 2/2015 | Yeh | H01L 33/14 257/13 |

* cited by examiner

LIGHT-EMITTING DIODE

RELATED APPLICATIONS

This application claims priority to Taiwan Application Serial Number 102138694 filed Oct. 25, 2013, which is herein incorporated by reference.

BACKGROUND

Technical Field

The present disclosure relates to a light-emitting diode, and more particularly, to a light-emitting diode having a reflective layer.

Description of Related Art

FIG. 1 is a three-dimensional view of a conventional light-emitting diode 100. In FIG. 1, the light-emitting diode 100 has a first type semiconductor layer 110, a light-emitting layer 120, a second type semiconductor layer 130, a current spreading layer 140, a first electrode 150 and a second electrode 160. The light-emitting layer 120 is sandwiched between the first type semiconductor layer 110 and the second type semiconductor layer 130. The current spreading layer 140 covers the second type semiconductor layer 130. The first electrode 150 is positioned on the first semiconductor layer 110, and the second electrode 160 is positioned on the current spreading layer 140.

FIG. 2 is a schematic cross-sectional view of the conventional light-emitting diode 100 along the A-A' line in FIG. 1. In FIG. 2, the cross-sectional structure positioned on the second type semiconductor layer 130 is shown in detail, and the first type semiconductor layer 110 and the light-emitting layer 120 are omitted. The current blocking layer 170 is positioned on part of the surface of the second type semiconductor layer 130, and the current spreading layer 140 covers the current blocking layer 170 and the second type semiconductor layer 130. The reflective layer 180 is positioned on the current spreading layer 140 and over the current blocking layer 170. Further, the first electrode 150 is positioned on the reflective layer 180.

Referring to FIGS. 1 and 2, when a light B emits from the light-emitting layer 120, the light B may penetrate the second type semiconductor layer 130, the current blocking layer 170 and current spreading layer 140, and then be reflected by the reflective layer 180. However, when the light B goes through the second type semiconductor layer 130, the current blocking layer 170 and the current spreading layer 140, the energy of the light B is absorbed, and becomes a light C with weaker brightness, which reduces the light extraction of the light-emitting diode 100.

On another way, because the reflective layer 180 is usually made of metallic materials and partially exposed out of the light-emitting diode 100, the reflective layer 180 is vulnerable to corrosion from air or water vapor in the environment, resulting in a broken circuit of the light-emitting diode 100 and even the electrical failure.

In addition, in case of the light-emitting diode 100 under overdriving operation, the metallic material of the reflective layer 180 is apt to diffuse into the current spreading layer 140 and increases the surface resistance of the current spreading layer 140, so as to damage the structure of the light-emitting diode 100. Therefore, there is a need for an improved light-emitting diode and a manufacturing method thereof, so as to solve the aforementioned problems met in the art.

SUMMARY

The present disclosure provides a heat sink for electrical elements and a light-emitting device containing thereof, to solve the problems met in the art.

One embodiment of the present disclosure is to provide a light-emitting diode. The light-emitting diode includes a first type semiconductor layer, a light-emitting layer, a second type semiconductor layer, a reflective layer, a current blocking layer and a first current spreading layer.

The light-emitting layer is positioned on the first type semiconductor layer, and the second type semiconductor layer is positioned on the light-emitting layer. The reflective layer is positioned on part of the second type semiconductor layer, and exposes the other part of the second type semiconductor layer without the reflective layer thereon. The current blocking layer covers the reflective layer, and the first current spreading layer covers the exposed second type semiconductor layer and the current blocking layer.

According to one embodiment of the present disclosure, the material of the reflective layer includes a metal or a ceramic material. According to another embodiment of the present disclosure, the metal includes aluminum (Al), silver (Ag), rhodium (Rh) or a combination thereof.

According to one embodiment of the present disclosure, the first type semiconductor layer is an N-type semiconductor layer, and the second type semiconductor layer is a P-type semiconductor layer. According to another embodiment of the present disclosure, the first type semiconductor layer is an N-type gallium nitride (n-GaN), and the second type semiconductor layer is a P-type gallium nitride (p-GaN).

According to one embodiment of the present disclosure, the first current spreading layer includes a transparent conductive material. According to another embodiment of the present disclosure, the transparent conductive material includes indium tin oxide (ITO), indium gallium oxide (IGO), indium zinc oxide (IZO) or indium gallium zinc oxide (IGZO).

According to one embodiment of the present disclosure, the light-emitting diode further includes a first electrode and a second electrode. The first electrode is positioned on the first current spreading layer and over the current blocking layer. The second electrode is positioned on the first type semiconductor layer.

According to one embodiment of the present disclosure, the light-emitting diode further includes a substrate positioned on the other side of the first type semiconductor layer opposite to the light-emitting layer.

Another embodiment of the present disclosure is to provide a light-emitting diode. The light-emitting diode includes a first type semiconductor layer, a light-emitting layer, a second type semiconductor layer, a second current spreading layer, a reflective layer, a current blocking layer and a third current spreading layer.

The light-emitting layer is positioned on the first type semiconductor layer, and the second type semiconductor layer is positioned on the light-emitting layer. The second current spreading layer covers the second type semiconductor layer. The reflective layer is positioned on part of the second current spreading layer, and exposes the other part of the second current spreading layer without the reflective layer thereon. The current blocking layer covers the reflective layer. The third current spreading layer covers the exposed second current spreading layer and the current blocking layer.

According to one embodiment of the present disclosure, the material of the reflective layer includes a metal or a ceramic material. According to another embodiment of the present disclosure, the metal includes aluminum (Al), silver (Ag), rhodium (Rh) or a combination thereof.

According to one embodiment of the present disclosure, the first type semiconductor layer is an N-type semiconductor layer, and the second type semiconductor layer is a P-type semiconductor layer. According to another embodiment of the present disclosure, the first type semiconductor layer is an N-type gallium nitride (n-GaN), and the second type semiconductor layer is a P-type gallium nitride (p-GaN).

According to one embodiment of the present disclosure, the second and third current spreading layers include a transparent conductive material. According to another embodiment of the present disclosure, the transparent conductive material includes indium tin oxide (ITO), indium gallium oxide (IGO), indium zinc oxide (IZO) or indium gallium zinc oxide (IGZO).

According to one embodiment of the present disclosure, the light-emitting diode further includes a first electrode and a second electrode. The first electrode is positioned on the third current spreading layer and over the current blocking layer. The second electrode is positioned on the first type semiconductor layer.

According to one embodiment of the present disclosure, the light-emitting diode further includes a substrate positioned on the other side of the first type semiconductor layer opposite to the light-emitting layer.

Further another embodiment of the present disclosure is to provide a light-emitting diode. The light-emitting diode includes a first type semiconductor layer, a light-emitting layer, a second type semiconductor layer, a fourth current spreading layer, a reflective layer, a current blocking layer and a fifth current spreading layer.

The light-emitting layer is positioned on the first type semiconductor layer, and the second type semiconductor layer is positioned on the light-emitting layer. The fourth current spreading layer covers part of the second type semiconductor layer, and exposes the other part of the second type semiconductor layer at a desired area. The reflective layer is positioned on the desired area. The current blocking layer covers the reflective layer. The fifth current spreading layer covers the fourth current spreading layer and the current blocking layer.

According to one embodiment of the present disclosure, the material of the reflective layer includes a metal or a ceramic material. According to another embodiment of the present disclosure, the metal includes aluminum (Al), silver (Ag), rhodium (Rh) or a combination thereof.

According to one embodiment of the present disclosure, the first type semiconductor layer is an N-type semiconductor layer, and the second type semiconductor layer is a P-type semiconductor layer. According to another embodiment of the present disclosure, the first type semiconductor layer is an N-type gallium nitride (n-GaN), and the second type semiconductor layer is a P-type gallium nitride (p-GaN).

According to one embodiment of the present disclosure, the fourth and fifth current spreading layers include a transparent conductive material. According to another embodiment of the present disclosure, the transparent conductive material includes indium tin oxide (ITO), indium gallium oxide (IGO), indium zinc oxide (IZO) or indium gallium zinc oxide (IGZO).

According to one embodiment of the present disclosure, the light-emitting diode further includes a first electrode and a second electrode. The first electrode is positioned on the fifth current spreading layer and over the current blocking layer. The second electrode is positioned on the first type semiconductor layer.

According to one embodiment of the present disclosure, the light-emitting diode further includes a substrate positioned on the other side of the first type semiconductor layer opposite to the light-emitting layer.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
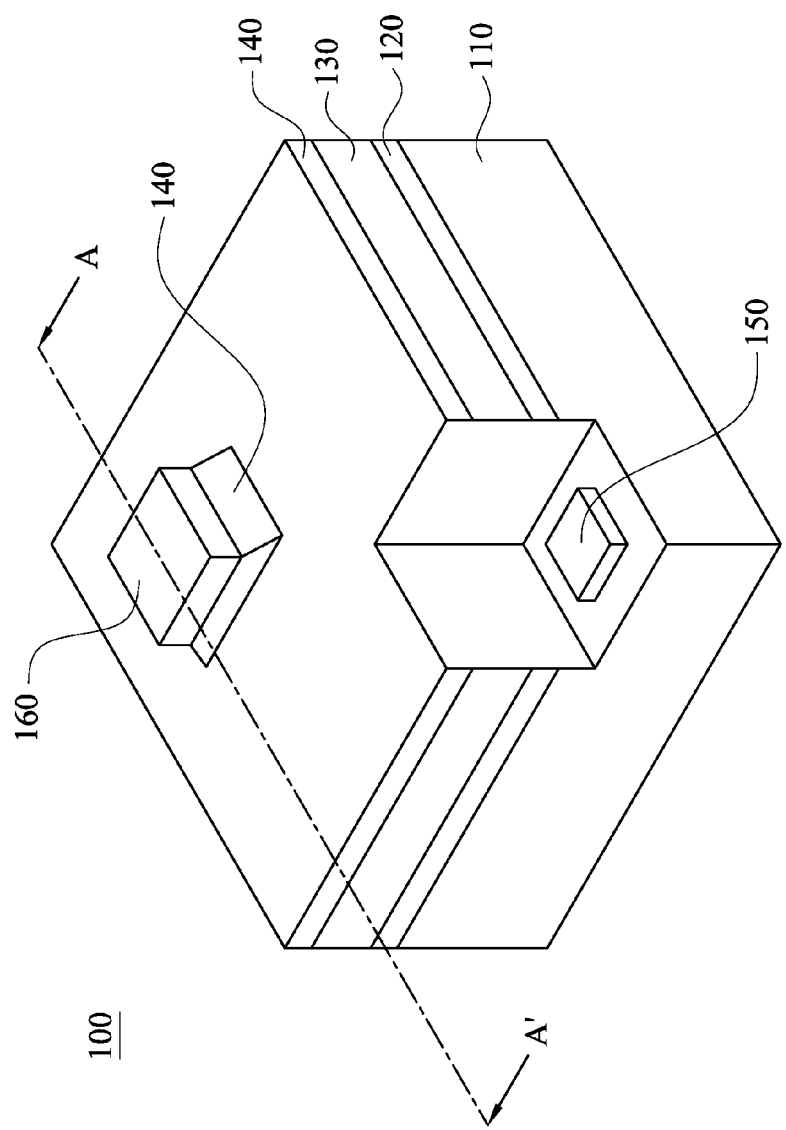
FIG. 1 is a three-dimensional view of a conventional light-emitting diode 100.
Figure 2:
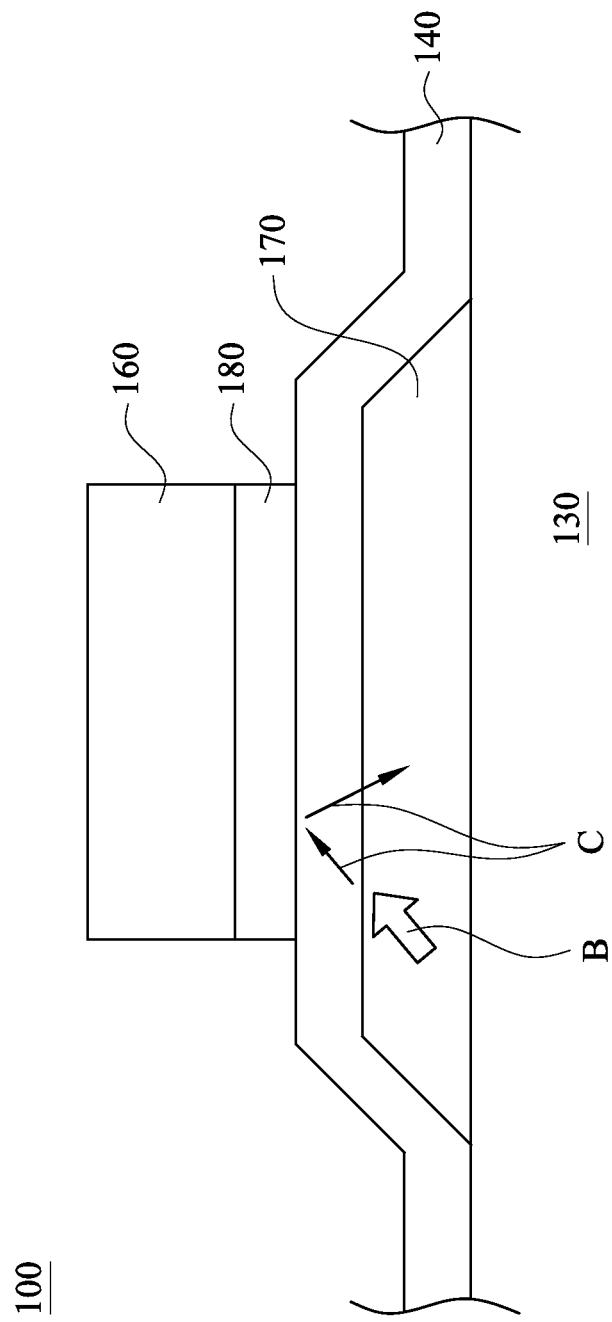
FIG. 2 is a schematic cross-sectional view of the conventional light-emitting diode 100 taken along the A-A' line.

The embodiments of the transparent conductive structure and a method for manufacturing the same of the present disclosure are discussed in detail below, but not limited the scope of the present disclosure. The same symbols or numbers are used to the same or similar portion in the drawings or the description. And the applications of the present disclosure are not limited by the following embodiments and examples which the person in the art can apply in the related field.

The singular forms "a," "an" and "the" used herein include plural referents unless the context clearly dictates otherwise. Therefore, reference to, for example, a metal layer includes embodiments having two or more such metal layers, unless the context clearly indicates otherwise. Reference throughout this specification to "one embodiment" means that a particular feature, structure, or characteristic described in connection with the embodiment is included in at least one embodiment of the present disclosure. Therefore, the appearances of the phrases "in one embodiment" or "in an embodiment" in various places throughout this specification are not necessarily all referring to the same embodiment. Further, the particular features, structures, or characteristics may be combined in any suitable manner in one or more embodiments. It should be appreciated that the following figures are not drawn to scale; rather, the figures are intended; rather, these figures are intended for illustration.

Figure 3:
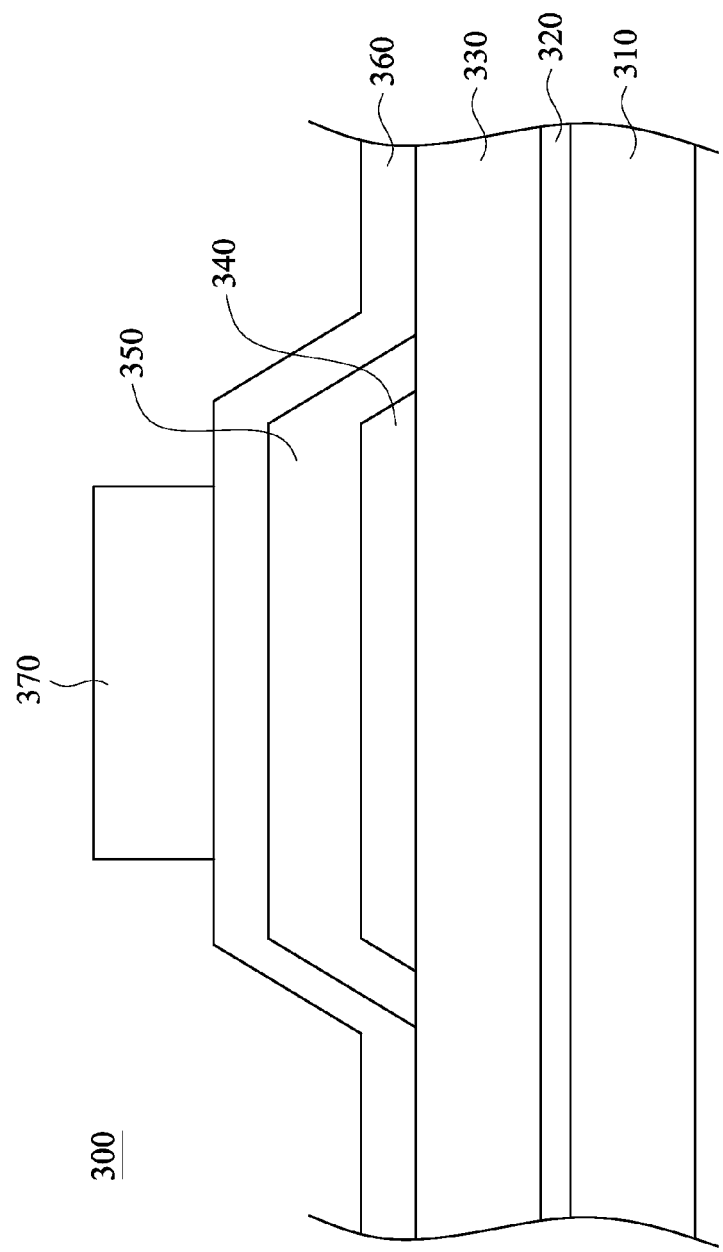
FIG. 3 is a schematic cross-sectional view of a light-emitting diode 300 according to one embodiment of the present disclosure.

FIG. 3 is a schematic cross-sectional view of a light-emitting diode 300 according to a first embodiment of the present disclosure. In FIG. 3, a light-emitting diode 300 includes a first type semiconductor layer 310, a light-emitting layer 320, a second type semiconductor layer 330, a reflective layer 340, a current blocking layer 350, a current spreading layer 360 and an electrode 370.

The light-emitting layer 320 is positioned on the first type semiconductor layer 310, and the second type semiconductor layer 330 is positioned on the light-emitting layer 320. In one embodiment of the present disclosure, the first type semiconductor layer 310 is an N-type semiconductor layer, and is preferably an N-type gallium nitride. In one embodiment of the present disclosure, the second type semiconductor layer 330 is a P-type semiconductor layer, and is preferably a P-type gallium nitride.

The reflective layer 340 is positioned on part of the second type semiconductor layer 330, and exposes the other part of the second type semiconductor layer 330. In one embodiment of the present disclosure, the material of the reflective layer 340 includes a metal or a ceramic material, wherein the metal includes aluminum (Al), silver (Ag), rhodium (Rh) or a combination thereof.

The current blocking layer 350 covers the reflective layer 340, and the current spreading layer 360 covers the exposed second type semiconductor layer 330 and the current blocking layer 350. In one embodiment of the present disclosure, the current spreading layer 360 includes a transparent conductive material including indium tin oxide (ITO), indium gallium oxide (IGO), indium zinc oxide (IZO) or indium gallium zinc oxide (IGZO).

The electrode 370 is positioned on the current spreading layer 360 and over the current blocking layer 350. In one embodiment of the present disclosure, the light-emitting diode further includes another electrode electrically connected to first type semiconductor layer. In one embodiment of the present disclosure, the light-emitting diode further includes a substrate on the other side of the first type semiconductor layer opposite to the light-emitting layer.

Figure 4:
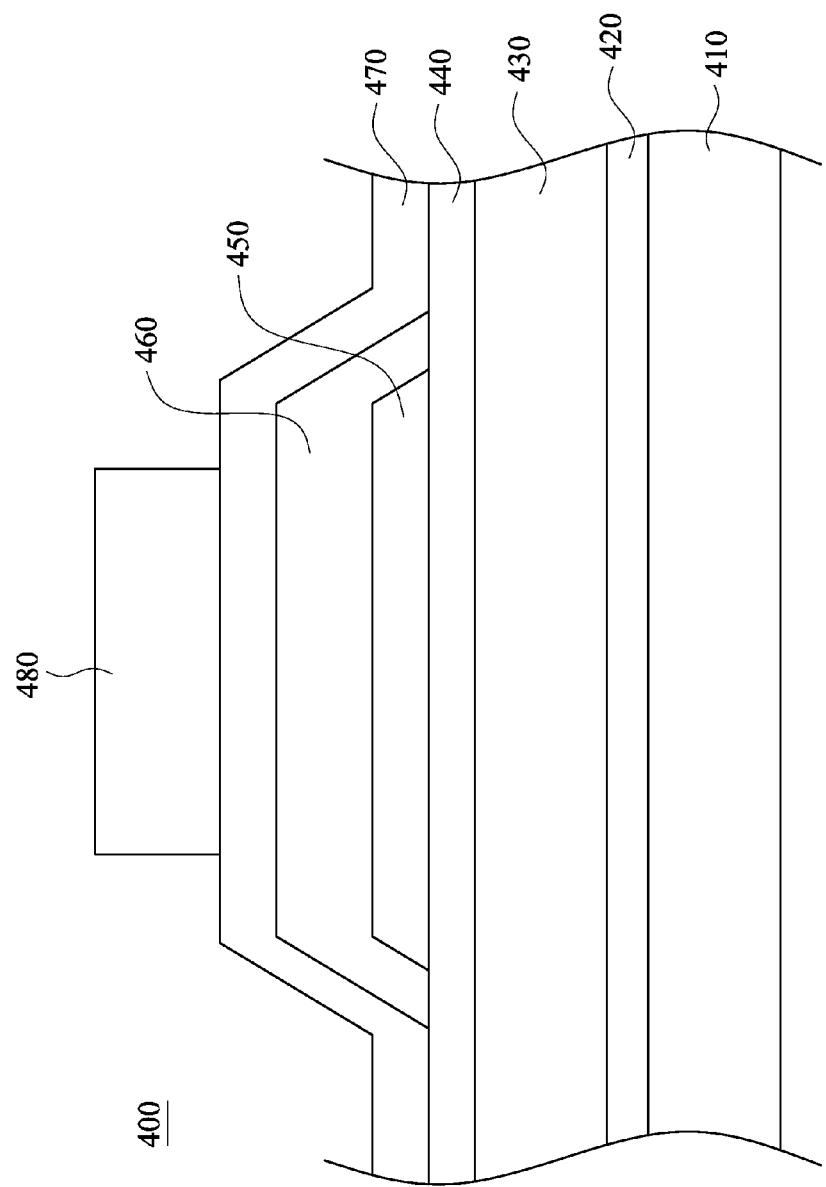
FIG. 4 is a schematic cross-sectional view of a light-emitting diode 400 according to one embodiment of the present disclosure.

FIG. 4 is a schematic cross-sectional view of a light-emitting diode 400 according to a second embodiment of the present disclosure. In FIG. 4, the light-emitting diode 400 includes a first type semiconductor layer 410, a light-emitting layer 420, a second type semiconductor layer 430, a first current spreading layer 440, a reflective layer 450, a current blocking layer 460, a second current spreading layer 470 and an electrode 480.

The light-emitting layer 420 is positioned on the first type semiconductor layer 410, and the second type semiconductor layer 430 is positioned on the light-emitting layer 420. In one embodiment of the present disclosure, the first type semiconductor layer 410 is an N-type semiconductor layer, and is preferably an N-type gallium nitride. In one embodiment of the present disclosure, the second type semiconductor layer 430 is a P-type semiconductor layer, and is preferably a P-type gallium nitride.

The first current spreading layer 440 covers the second type semiconductor layer 430. In one embodiment of the present disclosure, the first current spreading layer 440 includes a transparent conductive material including indium tin oxide (ITO), indium gallium oxide (IGO), indium zinc oxide (IZO) or indium gallium zinc oxide (IGZO).

The reflective layer 450 is positioned on part of the first current spreading layer 440, and exposes the other part of the first current spreading layer 440 which the reflective layer 450 is not positioned on. In one embodiment of the present disclosure, the material of the reflective layer 450 includes a metal or a ceramic material, wherein the metal includes aluminum (Al), silver (Ag), rhodium (Rh) or a combination thereof.

The current blocking layer 460 covers the reflective layer 450, and the second current spreading layer 470 covers the current blocking layer 460 and the first current spreading layer 440. In one embodiment of the present disclosure, the second current spreading layer 470 includes a transparent conductive material including indium tin oxide (ITO), indium gallium oxide (IGO), indium zinc oxide (IZO) or indium gallium zinc oxide (IGZO).

The electrode 480 is positioned on the second current spreading layer 470 and over the current blocking layer 460. In one embodiment of the present disclosure, the light-emitting diode further includes another electrode electrically connected to first type semiconductor layer. In one embodiment of the present disclosure, the light-emitting diode further includes a substrate on the other side of the first type semiconductor layer opposite to the light-emitting layer.

Compared to the first embodiment, the second embodiment further includes the first transparent conductive layer 440 between the second type semiconductor layer 430 and a reflective layer 450. Due to manufacturing a transparent conductive layer, a light-emitting diode is usually needed to form an ohmic contact by performing an annealing process. However, the annealing process may cause the reflective layer damaged, so in this embodiment by performing an annealing process, the first current spreading layer is first formed to have an ohmic contact with the second type semiconductor layer. Then, the second current spreading layer which does not need an annealing process is formed after the formation of the reflective layer and the current blocking layer. Therefore, the present disclosure may be more optimized.

Figure 5:
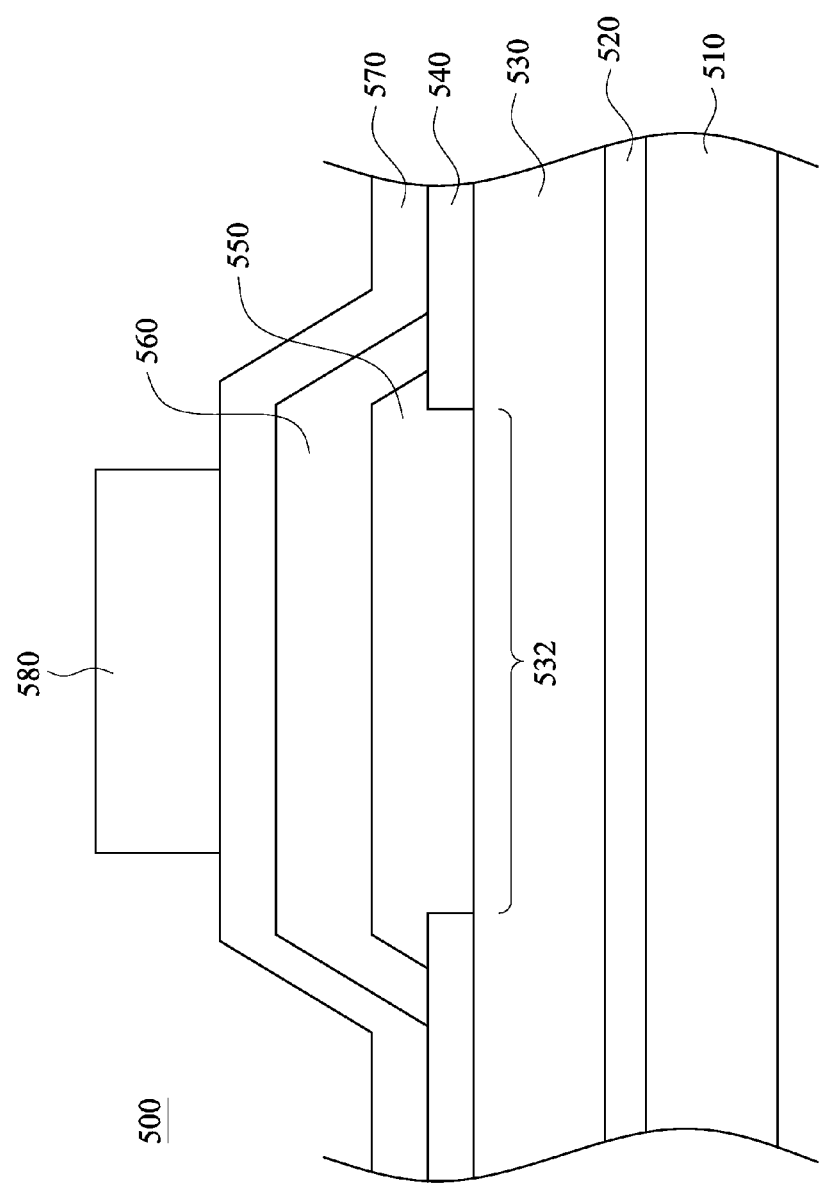
FIG. 5 is a schematic cross-sectional view of a light-emitting diode 500 according to one embodiment of the present disclosure.

FIG. 5 is a schematic cross-sectional view of a light-emitting diode 500 according to a third embodiment of the present disclosure. In FIG. 5, the light-emitting diode 500 includes a first type semiconductor layer 510, a light-emitting layer 520, a second type semiconductor layer 530, a first current spreading layer 540, a reflective layer 550, a current blocking layer 560, a second current spreading layer 570 and an electrode 580.

The light-emitting layer 520 is positioned on the first type semiconductor layer 510, and the second type semiconductor layer 530 is positioned on the light-emitting layer 520. In one embodiment of the present disclosure, the first type semiconductor layer 510 is an N-type semiconductor layer, and is preferably an N-type gallium nitride. In one embodiment of the present disclosure, the second type semiconductor layer 530 is a P-type semiconductor layer, and is preferably a P-type gallium nitride.

The first current spreading layer 540 partially covers the second type semiconductor layer 530, and exposes the second type semiconductor layer 530 at a desired area 532. In one embodiment of the present disclosure, the first current spreading layer 540 includes a transparent conductive material including indium tin oxide (ITO), indium gallium oxide (IGO), indium zinc oxide (IZO) or indium gallium zinc oxide (IGZO).

The reflective layer 550 is positioned on the desired area 532. In one embodiment of the present disclosure, the reflective layer 550 also partially covers the first current spreading layer 540. In one embodiment of the present disclosure, the material of the reflective layer 550 includes a metal or a ceramic material, wherein the metal includes aluminum (Al), silver (Ag), rhodium (Rh) or a combination thereof.

The current blocking layer 560 covers the reflective layer 550, and the second current spreading layer 570 covers the current blocking layer 560 and the first current spreading layer 540. In one embodiment of the present disclosure, the second current spreading layer 570 includes a transparent conductive material including indium tin oxide (ITO), indium gallium oxide (IGO), indium zinc oxide (IZO) or indium gallium zinc oxide (IGZO).

The electrode 580 is positioned on the second current spreading layer 570 and over the current blocking layer 560. In one embodiment of the present disclosure, the light-emitting diode further includes another electrode electrically connected to first type semiconductor layer. In one embodiment of the present disclosure, the light-emitting diode further includes a substrate on the other side of the first type semiconductor layer opposite to the light-emitting layer.

Compared to the second embodiment, the first current conductive layer in the third embodiment has an opening under the reflective layer to directly connect the reflective layer and the second type semiconductor layer, so that the light absorption of the first current spreading layer may be decreased. Thus, the present disclosure may be more optimized.

In embodiments of the present disclosure, the reflective layer is positioned between the current blocking layer and the second type semiconductor layer, and is covered by the current blocking layer. The current blocking layer has higher current resistance, so current may neither go through the reflective layer to make the metallic material diffusing into the current spreading layer, nor cause the damage of the LED structure. Therefore, the light-emitting diode provided by embodiments of the present disclosure may sustain an overdriving operation.

Additionally, the reflective layer may avoid collision of air or water vapor in outside to increase the reliability of the LED because the reflective layer is embedded in and dose not expose on the LED structure.

Further, because of the reflective layer between the current blocking layer and the second type semiconductor layer, the light absorption of the current blocking layer and/or the current spreading layer may be decreased. When a light is reflected by the reflective layer, the light brightness may not be decreased, so as to increase the light extraction of LED.

Although embodiments of the present disclosure and their advantages have been described in detail, they are not used to limit the present disclosure. It should be understood that various changes, substitutions and alterations can be made herein without departing from the spirit and scope of the present disclosure. Therefore, the protecting scope of the present disclosure should be defined as the following claims.

What is claimed is:
1. A light-emitting diode, comprising:
a first type semiconductor layer;
a light-emitting layer positioned on the first type semiconductor layer;
a second type semiconductor layer positioned on the light-emitting layer;
a trapezoidal reflective layer positioned on part of the second type semiconductor layer, and exposing the other part of the second type semiconductor layer without the trapezoidal reflective layer thereon, wherein an upper surface of the trapezoidal reflective layer is smaller than a lower surface of the trapezoidal reflective layer;
a current blocking layer covering the reflective layer; and
a first current spreading layer covering the exposed second type semiconductor layer and the current blocking layer.
2. The light-emitting diode of claim 1, wherein the material of the reflective layer includes a metal or a ceramic material.
3. The light-emitting diode of claim 2, wherein the metal comprises aluminum (Al), silver (Ag), rhodium (Rh) or a combination thereof.
4. The light-emitting diode of claim 1, wherein the first type semiconductor layer is an N-type semiconductor layer, and the second type semiconductor layer is a P-type semiconductor layer.
5. The light-emitting diode of claim 4, wherein the first type semiconductor layer is an N-type gallium nitride (n-GaN), and the second type semiconductor layer is a P-type gallium nitride (p-GaN).
6. The light-emitting diode of claim 1, wherein the first current spreading layer comprises a transparent conductive material.
7. The light-emitting diode of claim 6, wherein the transparent conductive material comprises indium tin oxide (ITO), indium gallium oxide (IGO), indium zinc oxide (IZO) or indium gallium zinc oxide (IGZO).
8. The light-emitting diode of claim 1, further comprising:
a first electrode positioned on the first current spreading layer and over the current blocking layer; and
a second electrode positioned on the first type semiconductor layer.
9. The light-emitting diode of claim 8, further comprising a substrate positioned on the other side of the first type semiconductor layer opposite to the light-emitting layer.
10. A light-emitting diode, comprising:
a first type semiconductor layer;
a light-emitting layer positioned on the first type semiconductor layer;
a second type semiconductor layer positioned on the light-emitting layer;
a second current spreading layer covering the second type semiconductor layer;
a trapezoidal reflective layer positioned on part of the second current spreading layer, and exposing the other part of the second current spreading layer without the trapezoidal reflective layer thereon, wherein an upper surface of the trapezoidal reflective layer is smaller than a lower surface of the trapezoidal reflective layer;
a current blocking layer covering the reflective layer; and
a third current spreading layer covering the exposed second current spreading layer and the current blocking layer.
11. The light-emitting diode of claim 10, wherein the material of the reflective layer comprises a metal or a ceramic material.
12. The light-emitting diode of claim 11, wherein the metal comprises aluminum (Al), silver (Ag), rhodium (Rh) or a combination thereof.
13. The light-emitting diode of claim 10, wherein the first type semiconductor layer is an N-type semiconductor layer, and the second type semiconductor layer is a P-type semiconductor layer.
14. The light-emitting diode of claim 13, wherein the first type semiconductor layer is an N-type gallium nitride (n-GaN), and the second type semiconductor layer is a P-type gallium nitride (p-GaN).
15. The light-emitting diode of claim 10, wherein the second and third current spreading layers comprise a transparent conductive material.
16. The light-emitting diode of claim 15, wherein the transparent conductive material comprises indium tin oxide (ITO), indium gallium oxide (IGO), indium zinc oxide (IZO) or indium gallium zinc oxide (IGZO).
17. The light-emitting diode of claim 1, further comprising:

a first electrode positioned on the third current spreading layer and over the current blocking layer; and a second electrode positioned on the first type semiconductor layer.

18. The light-emitting diode of claim 17, further comprising a substrate positioned on the other side of the first type semiconductor layer opposite to the light-emitting layer.

* * * * *